Figure 1:
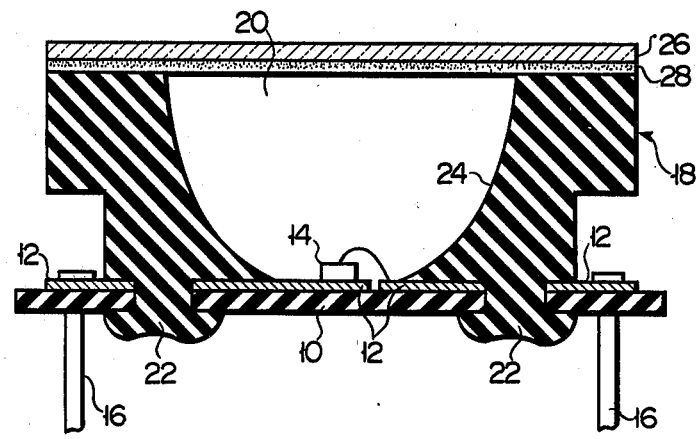

United States Patent [19]

Chida et al.

[11] 4,168,102
[45] Sep. 18, 1979

[54] LIGHT-EMITTING DISPLAY DEVICE INCLUDING A LIGHT DIFFUSING BONDING LAYER

[75] Inventors: Takeo Chida; Hiroshi Fujita, both of Kawasaki, Japan

[73] Assignee: Tokyo Shibaura Electric Co., Ltd., Japan

[21] Appl. No.: 841,556

[22] Filed: Oct. 12, 1977

[30] Foreign Application Priority Data

Oct. 12, 1976 [JP] Japan .................... 51-136916[U]

[51] Int. Cl.$^2$ .................... H05B 33/02; H05B 33/22
[52] U.S. Cl. .................... 313/111; 313/116; 313/500; 313/512
[58] Field of Search ............ 313/500, 499, 512, 111, 313/116; 428/323, 327; 350/126, 127

[56] References Cited

U.S. PATENT DOCUMENTS

| | | | |
|---|---|---|---|
| 3,243,626 | 3/1966 | Helvy et al. | 313/116 X |
| 3,552,822 | 1/1971 | Altman | 350/126 |
| 3,648,835 | 3/1972 | Yucel | 428/325 X |
| 3,780,357 | 12/1973 | Haitz | 313/499 X |
| 3,876,900 | 4/1975 | Amatsuka et al. | 313/500 X |
| 3,919,585 | 11/1975 | Schorr | 313/499 |
| 3,940,523 | 2/1976 | Lecoeur et al. | 428/327 X |
| 4,000,437 | 12/1976 | Lederhandler et al. | 313/500 |
| 4,058,750 | 11/1977 | Schöberl | 313/500 |

FOREIGN PATENT DOCUMENTS 48-91881 11/1973 Japan .

*Primary Examiner*—Palmer C. Demeo
*Attorney, Agent, or Firm*—Finnegan, Henderson, Farabow & Garrett

[57] ABSTRACT

A light-emitting display device comprising a printed wiring board impressed with a wiring pattern; a light-emitting element mounted on the printed wiring board and electrically connected to the wiring pattern; a reflector provided with a penetrating hole for receiving the light-emitting element at its lower opening and disposed on the printed wiring board, the inner wall of the penetrating hole acting as a reflection plane; a light-permeable film containing light-scattering materials and closing the upper opening of the penetrating hole; and a bonding layer containing light-scattering material, the bonding layer bonding the light-permeable film to the reflector.

10 Claims, 2 Drawing Figures

LIGHT-EMITTING DISPLAY DEVICE INCLUDING A LIGHT DIFFUSING BONDING LAYER

This invention relates to a light-emitting display device for visibly indicating numerals, characters and notations.

The prior art light-emitting display devices comprise, for example, a printed wiring board impressed with the prescribed patterns of wiring; a light-emitting element prepared from, for example, gallium phosphide (Gap) or gallium-arsenide-phosphide (GaAsP) and mounted on the printed wiring board; and a reflector bored with a penetrating hole for receiving the light-emitting element, with the inner wall of the penetrating hole designed to act as a reflection plane for reflecting upward a light given off from the light-emitting element. The upper opening of the penetrating hole of the reflector is closed with a light-permeable film containing light-scattering material. The light-permeable film is enclosed in a casing fixed to the printed wiring board and pressed against the reflector to be kept at rest.

The conventional light-emitting display device is expensive and bulky due to the necessity of providing the above-mentioned casing. Further disadvantages of the known light-emitting display device are that though the light-permeable film is pressed against the reflector by the casing, yet gaps arise between the light-permeable film and reflector. Light from the light-emitting element leaks through the gaps with the resultant decline in the desired shade contrast of an image indicated by the display device, and the fitting of the casing consumes a great deal of time. Furthermore once the light-emitting display device is set on a panel, it is difficult to take the case off the light-emitting display device and later replace the case in position.

It is accordingly the object of this invention to provide a compact light-emitting display device which can efficiently give off light rays of uniform intensity.

According to an aspect of this invention, there is provided a light-emitting display device which comprises a printed wiring board impressed with the prescribed patterns of wiring; a light-emitting element mounted on the printed wiring board to be electrically connected to the corresponding patterned wiring impressed on the printed wiring board; a member provided on the printed wiring board and bored with a penetrating hole, with the light-emitting element received in the proximity of one of both open end portions of the penetrating hole; and a light-permeable film which contains light-scattering material and is bonded to the bored member to close the other open end of the penetrating hole.

Figure 2:
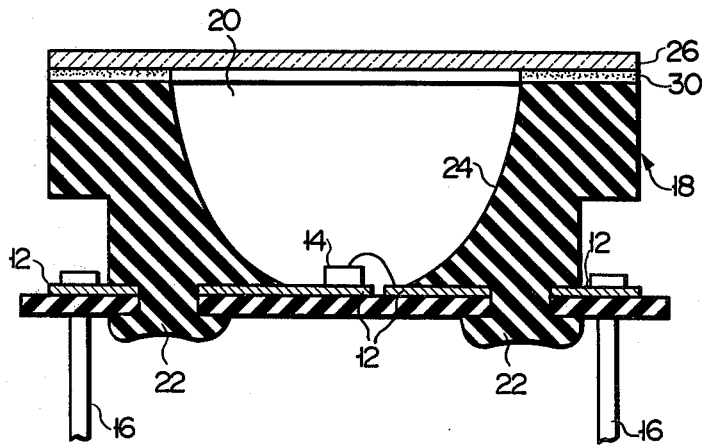

This invention can be more fully understood from the following detailed description when taken in conjunction with the accompanying drawing, in which:

FIG. 1 is a sectional view of a light-emitting display device embodying this invention; and FIG. 2 is a sectional view of a modification of the light-emitting display device of FIG. 1.

Referring to FIG. 1, the light-emitting display device of this invention comprises a printed wiring board 10 impressed with the prescribed patterns 12 of wiring and a light-emitting element 14 prepared, as is well known, from, for example, GaP or GaAsP and mounted on the printed wiring board 10 for electrical connection to the corresponding patterned wiring 12. The patterned wiring 12 is connected to a power source (not shown) through external lead lines 16, causing the light-emitting element 14 to be energized by the power source.

Provided on the printed wiring board 10 is a reflector 18 bored with a penetrating hole 20 for receiving the light-emitting element 14. The reflector 18 is formed of a white board 4 to 10 mm thick prepared from a resin, for example, polycarbonate, Acrylonitrile-chlorinated polyethylenestyrene (ACS), or Polybutylene-terephthalate (PBT). The reflector 18 is fixed to the printed wiring board 10 by depressing the tips of projections 22 which are integrally formed with the reflector 18 and extend downward through the penetrating holes bored in the printed wiring board 10, so as to cause the edges of the depressed tip portions to spread over the underside of the printed wiring board 10 near the penetrating holes. The inner wall 24 of the penetrating hole 20 of the reflector 18 acts as a reflection plane. The upper open end of the penetrating hole 20 of the reflector 18 is closed with a light-permeable film 26 bonded to the upper part of the reflector 18 by an adhesive layer 28. The light-permeable film is formed of light-permeable resin, for example, polyester resin containing or having on its surface fine granular or fibrous light-scattering material such as titanium (Ti), titanium oxide (TiO), magnesium oxide (MgO) and calcium carbonate ($CaCO_3$).

It is desired that the light-permeable film 26 have a thickness of 25 to 250 microns, preferably 75 microns, be flexible and bear the prescribed color, for example, red, to make a display in good shade contrast. The adhesive layer 28, for example, of acrylic series type, is applied on the underside of the light-permeable film 26. This light-permeable film 26 can be easily adhered to or removed from the reflector 18 substantially in the same manner as ordinary adhesive tape.

Light given off from the light-emitting element 14 energized by a power source (not shown) connected to element 14 through a patterned wiring 12 is reflected upward by the reflection plane 24 of the reflector 18 and sent forth to the outside through the adhesive layer 28 and light-permeable film 26.

Since the light-permeable film 26 is tightly bonded to the reflector 18, light from the light-emitting element 14 is prevented from leaking through the interstice lying between the light-permeable film and reflector 18. In contrast, if a casing held the light-permeable film 26 in place, a sufficient gap might exist that it would allow the passage of light between the interstice. Also, since the light-permeable film 26 can be made as thin as 25 to 250 microns, light which has entered the light-permeable film 26 from the light-emitting element 14 is effectively prevented from being transmitted laterally along the light-permeable film 26 and instead passes outwardly through the light-permeable film 26.

FIG. 2 shows a modification of the light-emitting display device of FIG. 1. This modification has substantially the same construction as the display device of FIG. 1, except that an adhesive layer 30 for bonding the light-permeable film 26 to the surface of the reflector 18 is only mounted on the surface of the reflector 18.

Having described the above-mentioned embodiments of this invention, it will be understood that the invention is capable of various modifications, changes and adaptations. For instance, it is possible to use the ordinary light-permeable film free from light-scattering material and include the material in the adhesive layer 28 instead of in the light-permeable film 26 used in the aforesaid embodiment of FIG. 1.

Referring to FIG. 2, the light-permeable film 26 may be replaced by another type of light-permeable film, whose underside, that is, the plane being bonded to the reflector 18 is sufficiently roughened for effective scattering of the light received.

For briefness, description by reference to FIGS. 1 and 2 refers to a single light-emitting display device comprising a light-emitting element. However, a plurality of such light-emitting display devices may be assembled, as is well known, in the form of the numeral "8", thereby easily indicating numerals, characters and notations.

What we claim is:

1. A light-emitting display device which comprises a printed wiring board impressed with a wiring pattern; a light-emitting element mounted on the printed wiring board to be electronically connected to the wiring pattern; a bored member provided with a penetrating hole for receiving the light-emitting element in one open end portion thereof and disposed on the printed wiring board; a thin light-permeable film containing light-scattering material disposed on the surface of said bored member to close the other open end portion of the penetrating hole; and bonding layer means, containing light-scattering material and being applied substantially all over the underside of said light-permeable film, for adhering the light-permeable film to said bored member and for transmitting and diffusing light emitted from said light-emitting element.

2. The light-emitting display device according to claim 1, wherein the light-permeable film has a thickness ranging from 25 microns to 250 microns.

3. The light-emitting display device according to claim 1, wherein the light-permeable film is prepared from polyester resin and contains titanium oxide as light-scattering material.

4. The light-emitting display device according to claim 1, wherein said bored member is a reflector whose inner wall defining the penetrating hole acts as a reflection plane which is curved to reflect a light from the light-emitting element toward the light-permeable film.

5. The light-emitting display device according to claim 1 wherein the bonding layer means is capable of permitting the easy removal of the thin light-permeable film from the bored member.

6. A light-emitting display device, which comprises a printed wiring board impressed with the prescribed patterns of wiring; a light-emitting element mounted on the printed wiring board to be electrically connected to the corresponding patterned wiring impressed on the printed wiring board; a member which is provided with a penetrating hole for receiving the light-emitting element in one of the two open end portions thereof and disposed on the printed wiring board; a thin light-permeable film bonded to the surface of said bored member to close the other open end portion of the penetrating hole; and bonding layer means containing a light-scattering material and being applied substantially all over the underside of the light-permeable film for adhering the light-permeable film to said bored member and for transmitting and diffusing light emitted from said light-emitting element.

7. The light-emitting display device according to claim 6, wherein the light-permeable film has a thickness ranging from 25 microns to 250 microns.

8. The light-emitting display device according to claim 6, wherein the light-permeable film is prepared from polyester resin and contains titanium oxide as light-scattering material.

9. The light-emitting display device according to claim 6, wherein said bored member is a reflector whose inner wall defining the penetrating hole acts as a reflection plane which is curved to reflect a light from the light-emitting element toward the light-permeable film.

10. The light-emitting display device according to claim 6 wherein the bonding layer means is capable of permitting the easy removal of the thin light-permeable film from the bored element.

* * * * *